United States Patent [19]

Streifer et al.

[11] Patent Number: 4,799,223

[45] Date of Patent: Jan. 17, 1989

[54] SPLIT CONTACT PHASED ARRAY LASERS

[75] Inventors: William Streifer, Palo Alto, Calif.;
Robert D. Burnham, Wheaton, Ill.;
Thomas L. Paoli, Los Altos, Calif.

[73] Assignee: Xerox Corporation, Stamford, Conn.

[21] Appl. No.: 82,774

[22] Filed: Aug. 6, 1987

[51] Int. Cl.[4] .................................................. H01S 3/10
[52] U.S. Cl. ........................................ 372/24; 372/46; 372/50; 372/96
[58] Field of Search ...................... 372/24, 45, 46, 50, 372/96

[56] References Cited

U.S. PATENT DOCUMENTS

| | | | |
|---|---|---|---|
| 3,701,044 | 10/1972 | Paoli et al. | 372/24 |
| 3,969,686 | 7/1976 | Scrifers et al. | 372/96 |
| 4,217,561 | 8/1980 | Scrifers et al. | 372/24 |
| 4,219,785 | 8/1980 | Scrifers et al. | 372/46 |
| 4,255,717 | 3/1981 | Scrifers et al. | 372/24 |
| 4,475,200 | 10/1984 | Lee | 372/24 |
| 4,661,962 | 4/1987 | Clayton | 372/50 |
| 4,718,069 | 1/1988 | Streifer et al. | 372/50 |
| 4,719,634 | 1/1988 | Streifer et al. | 372/50 |

OTHER PUBLICATIONS

Donald R. Scifres et al., "Lateral Beam Collimation of a Phased Array Semiconductor Laser", Applied Physics Letters, vol. 41(7), pp. 614–616, Oct. 1, 1982.

Primary Examiner—Léon Scott, Jr.
Attorney, Agent, or Firm—W. Douglas Carothers, Jr.

[57] ABSTRACT

A split contact phased array laser comprising a plurality of parallel emitters under phase locked operation and productive of an output beam having a preferred emission wavelength and preferred far field mode of operation. The charge distribution profile in the laser is changed to cause the output beam to deflect and scan in the far field. The improvement in the laser is the provision of at least three independently current pumped segments formed transversely of said emitters wherein at least one of the segments is current pumped above threshold level sufficient to primarily determine the emission wavelength and mode of operation of the laser while the current supplied to the remaining segments is below this level and is varied relative to one another to cause the output beam to deflect and scan in the far field without substantial change to the emission wavelength and mode of operation. This is because the charge density is essentially clamped under the one dominant contact segment and is only minimally influenced by further changes in the pumping current.

2 Claims, 2 Drawing Sheets

SPLIT CONTACT PHASED ARRAY LASERS

BACKGROUND OF THE INVENTION

This invention relates to semiconductor lasers and more particularly to improvements in phased locked or phased array lasers capable of output beam deflection and scanning in the far field. Examples of monolithic scanning phase locked array lasers including area contract regions are disclosed in Scifres et al U.S. Pat. No. 4,217,561 and Scifres et al U.S. Pat. No. 4,219,785, both assigned to the assignee herein.

Known in the art of phased array lasers comprising a plurality of emitters having with closely spaced injection current stripes to provide for constructive interference between spaced emitters due to the overlap of the evanescent optical fields of adjacent laser emitters. Examples of such phased array lasers are disclosed, for example, in Paoli et al, U.S. Pat. No. 3,701,044 and in the article of Donald R. Scifres et al entitled, "Lateral Beam Collimation of a Phased Array Semiconductor Laser", *Applied Physics Letters,* Vol. 41(7), pp.614-616, Oct. 1, 1982.

The concept of separately addressing the individual laser strips of a phased array laser to provide for beam steering or scanning is also known on the art and is analogous to phased array radar. However, there exists practical limitations in electrically addressing and modulating closely spaced stripes or emitters because when a group of parallel stripes are placed on 10 $\mu$m centers or less, it is difficult, if not impossible, to bond electrical leads to individual stripes without electrical contact to adjacent stripes.

An alternative approach was proposed by Paoli et al, supra, of using a common contact over all of the stripes but breaking the contact into two segments at an angle, as illustrated relative to laser 10 in FIG. 1 herein.

Phased array laser 10 in FIG. 1 comprises a plurality of phase locked emitters $L_1, L_2, L_3 \ldots L_{N-1}$ and $L_N$, as represented by current confinement stripes 12. The optical cavities of emitters $L_1-L_N$ extend for the full length L of array laser except their absence in region 18. The pumping of emitters $L_1-L_N$ is divided into two segments 14 and 16, represented by area metal contacts separated by electrical isolation region 18. The area of strips 12 beneath area contact 14 are pumped by current, $I_1$, while the area of stripes 12 beneath area contact 16 are pumped by current, $I_2$. By varying current, $I_1$, relative to current, $I_2$, several functional attributes occur. First, because the real and imaginary refractive index of laser 10 depend upon the active region charge density, and because area contacts 14 and 16 area diagonally across emitters $L_1-L_N$, the charge distribution profile will vary linearly, i.e., the effective optical cavity length will vary linearly in each pumped segment 14 and 16 from emitter $L_1-L_N$. Thus, by varying the relationship of currents $I_1$ and $I_2$, different indices of refraction are provided in the regions beneath area contacts 14 and 16 causing a relative phase shifting between emitters that correspondingly causes output beam 11 from laser 10 to deflect or scan in the far field.

Second, variations of current, $I_1$, relative to current, $I_2$, will also influence the emission wavelength of laser 10.

Third, such variations of current, $I_1$, relative to current, $I_2$, may serve to couple adjacent emitters of laser 10 in phase as opposed to out of phase by 180°. Phased array lasers may generally operate with emitters 180° out of phase, as the favored mode of operation. However, such a mode of operation is undesirable for laser applications, such as raster output scanners or optical disk storage systems, because at least two dominant lobes will be emitted in the far field. A beam with two far field lobes is not useful in these applications.

Thus, while phased array laser 10 does have beam scanning capabilities, it is not easily applied as a beam scanning device since upon variance of $I_1$ relative to $I_2$, undesirable variance in mode of operation will also correspondingly occur along with variance in the emission wavelength, which is not acceptable for the above mentioned applications.

Thus, the principal of this invention is to provide a split contact phased array laser which has beam steering capabilities with maintenance of selected emission wavelength and with spatial mode control.

SUMMARY OF THE INVENTION

According to this invention, a split contact phased array laser provides several contract regions, instead of two such regions, in order to enable the current clamping by the maintenance of a constant charge density under one of the contacts while the current supplied to the other remaining contacts may be varied one relative to the other to provide for beam scanning in the far field while maintaining a desired emission wavelength and single mode of operation with single lobe in the far field pattern due to the clamping at the one contact, i.e. the charge density established under the one contact essentially determines the emission wavelength and mode of the laser and is only minimally influenced by further changes in the current at this point.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 2:
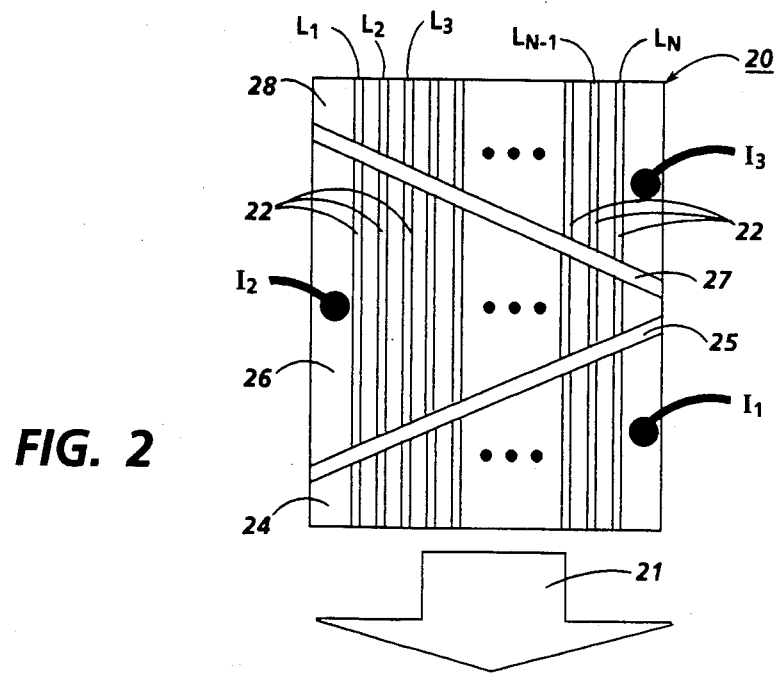
FIG. 2 is a plan view of an embodiment of a split contact phased array laser of this invention.

Reference is now made to FIG. 2 wherein there is disclosed a three split contact phased array laser 20 comprising this invention. Laser 20 comprises a plurality of phase locked laser emitters $L_1-L_N$ having current confinement means represented by stripes 22 extending for the full length of laser 20 except for the absence thereof in electrical isolation regions 25 and 27. The structure of phased array laser 20 may be comprised of those known in the art, such as the phase locked array laser with evanescent wave coupling disclosed in article of Scifres et al, supra.

Laser 20 is divided into three independently pumped segments 24, 26 and 28 represented by area metal contacts separated by electrical isolation regions 25 and 27. Isolation regions 25 and 27 may be provided by removing the contact metal at these regions using an etching technique or other such process known in the art. Additionally, proton bombardment is extended into and through the active region of laser 20 in these regions. The region of stripes 22 beneath area contact 24 is pumped by current, $I_1$; the region of stripes 22 beneath area contact 26 is pumped by current, $I_2$; and the region of stripes 22 beneath area contact 28 is pumped by current, $I_3$. In the operation of laser 20, one of the area contacts 24, 26, or 28 is independently pumped sufficiently above threshold operation such that the charge density created under the contact is clamped or sufficiently large to operate the array independent of the operation of the other two area contacts so as to substantially maintain per se a desired frequency of operation and mode of operation. By varying the current supplied to the other two area contacts, one relative to the other, output beam 21 of laser 20 will deflect and scan in the far field without substantial change in emission wavelength and spatial fundamental mode operation due to the fact that the charge density under the first area contact is sufficient dominant to determine the overall operation of the laser to remain in fundamental supermode with a single lobe far field pattern at the selected emission wavelength of operation. Thus, the current through the first area contact will maintain desired laser operation regardless of the variance of current operation relative to the other two area contacts as long as their operations remain unclamped, i.e., the variance of the pumping current to these segments is not sufficient to provide a charge density that will clamp the operation of array laser 20.

Thus, the relationship of operation between these latter two segments of laser 20 may be independently varied relative to each other to electrically vary the charge distribution profile therebetween to, in turn, cause far field scanning of output beam 21 but the charge distribution in either segment and the changes made to the charge distribution at those segments are not sufficiently significant, compared to the electrical charge injected through the clamped or dominate segment, to operate as the principal factor in determining overall operating frequency and mode of operation of laser 20. Once this dominant charge distribution is clamped, the charge distribution profiles relative to the other two laser segments may be varied to deflect and scan the far field radiation pattern without substantial effect to emission wavelength and operation mode set by the dominant charge distribution profile.

As a specific example, segment 24 of laser 20 may be operated well above current threshold with a sufficiently large charge density so as to be the primary determinate of fundamental laser operation relative to emission wavelength and operation mode. Once this condition has been established, the pumping current to segments 26 and 28 may be varied one relative to the other so that, for example, by varying $I_2$ to be increasingly greater than $I_3$, output beam 21 will deflect and scan to the left and by varying $I_3$ to be increasingly greater than $I_2$, output beam 21 will deflect and scan to the right.

Other configurations and geometries of contact segments of a phase locked array laser are possible. The embodiment of FIG. 2 represents the minimum amount of segments possible to utilize the fundamental control concept of this invention. Thus, there may be three or more split contacts and segments of operation undergoing independent pumping in the split contact phased array lasers of this invention.

Figure 3:
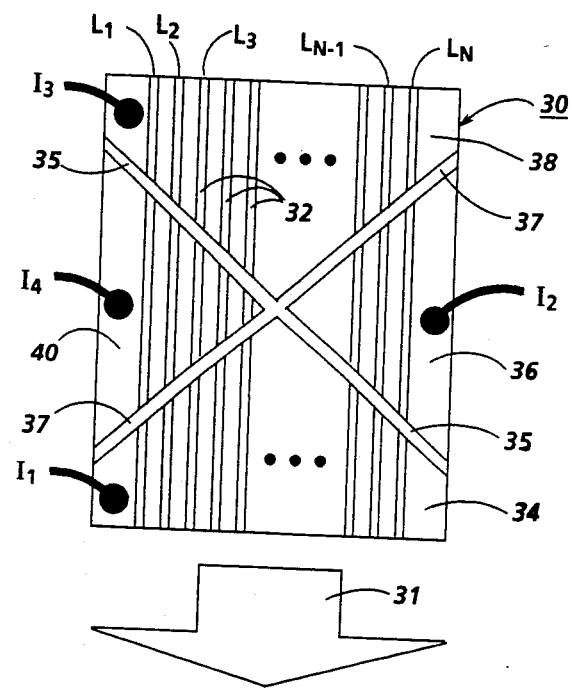
FIG. 3 is another embodiment of a split contact phased array laser of this invention.

FIG. 3 illustrates a four split contact phased array laser 30. Laser 30 comprises a plurality of phased lock emitters $L_1$-$L_N$ having current confinement stripes 32 extending for the full length of laser 30 except for their absence in electrical isolation regions 35 and 37. Laser 30 is divided into four independently pumped segments 34, 36, 38 and 40 represented by area metal contacts separated by electrical isolation regions 35 and 37, formed in a manner as previously explained in connection with laser 20, forming an "X" configuration across the array of stripes 32. The region of stripes 32 beneath area contact 34 is pumped by current, $I_1$; the region of stripes 32 beneath area contact 36 is pumped by current, $I_2$; the region of stripes 32 beneath area contact 38 is pumped by current, $I_3$; and the region of stripes 32 beneath area contact 40 is pumped by current, $I_4$. In the operation of phased array laser 30, one of the area contacts 34 or 38, for example, is independently pumped sufficiently above threshold operation of laser 30 so that the charge density created under the contact is clamped. By varying the current $I_2$, $I_4$ and together with either $I_1$ or $I_3$, relative to each other, output beam 31 will deflect and scan in the far field without substantial change in the emission wavelength and spatial fundamental mode operation due to the fact that the current into contact 34 or 38 is sufficiently dominant to maintain their set conditions without being influenced by variance of the pumping currents to the other unclamped area contacts.

Alternately, laser 30 could also be operated by strongly exciting both segments 34 and 38 while varying the pumping current, $I_2$ and $I_4$, to contacts 36 and 40 to deflect and scan output beam 31 in the far field.

Figure 1:
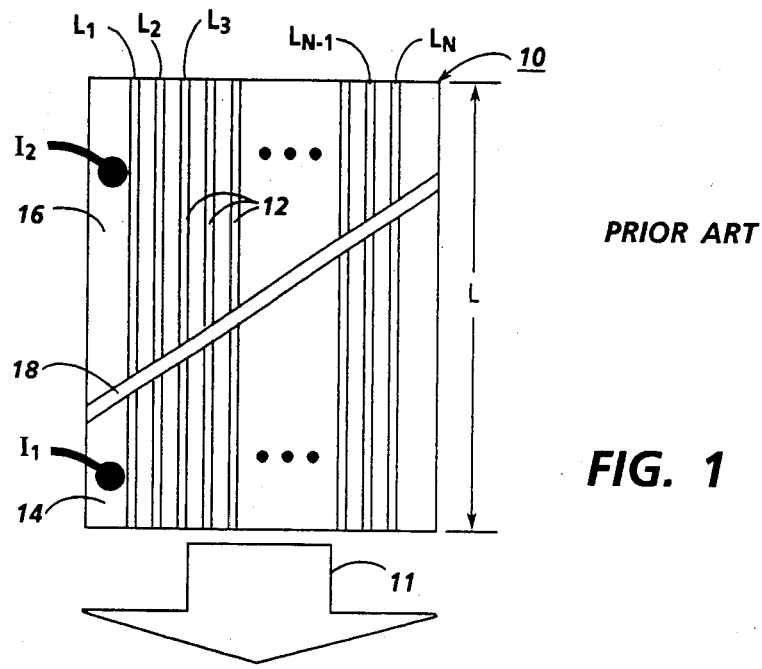
FIG. 1 is a plan view of a split contact phased array laser known in the art.

Other such variations in pumping segments 34-40 of phased array laser 30 are possible. For example, by setting $I_1$ equal to $I_2$ and $I_3$ equal to $I_4$, the configuration of FIG. 1 is replicated. By setting $I_1$ equal to $I_4$ and $I_2$ equal to $I_3$, the mirror image of the configuration of FIG. 1 is produced. By alternating the on and off pumping of these pairs of configurations, output beam 31 may be made to alternately deflect left and right in the far field while one of the segments 34 or 38 is continuously current pumped in a clamped or dominate state.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a split contact phased array laser comprising a plurality of parallel emitters under phase locked operation and productive of an output beam having a preferred emission wavelength and preferred far field mode of operation,
    means to pump said laser and change the charge distribution profile therein to cause said output beam to deflect and scan in the far field,
    the improvement wherein said laser is divided into at least three independently current pumped segments transversely of said emitters, and wherein at least one of said segments is current pumped above threshold level sufficient to primarily determine said emission wavelength and mode of operation of said laser while the current supplied to the other of said segments is below said level and is varied relative to one another to cause said output beam to deflect and scan in the far field without substantial change to said emission wavelength and mode of operation established relative to said one segment to thereby provide effective control of the overall active region charge density.

2. The method of operating a phased array laser comprising as plurality of parallel emitters producing an output beam in the far field comprising the steps of:

dividing said laser into at least three independently pumped segments transversely of said emitters, operating said laser by pumping at least one of said segments sufficiently above its threshold level of lasing operation to primarily determine the emission wavelength and modal operation of said laser by clamping the charge density established at said one segment or segments, independently varying the pumping current to the remaining segments relative to each other below said clamping threshold level to deflect and scan said output beam in the far field without substantial changing said emission wavelength and modal operation.

* * * * *